US012633930B2

(12) United States Patent (10) Patent No.: US 12,633,930 B2
Harush et al. (45) Date of Patent: May 19, 2026

(54) DUTY CYCLE CALIBRATION FOR PHASE-LOCKED LOOP

(71) Applicant: Cypress Semiconductor Corporation, San Jose, CA (US)

(72) Inventors: Avri Harush, Herzliya (IL); Oleg Dadashev, Hadera (IL)

(73) Assignee: Infineon Technologies Americas Corp., El Segundo, CA (US)

( * ) Notice: Subject to any disclaimer, the term of this patent is extended or adjusted under 35 U.S.C. 154(b) by 31 days.

(21) Appl. No.: 18/431,017

(22) Filed: Feb. 2, 2024

(65) Prior Publication Data

US 2025/0253855 A1 Aug. 7, 2025

(51) Int. Cl.
| | |
|---|---|
| *H03L 7/089* | (2006.01) |
| *H03K 5/156* | (2006.01) |
| *H03L 7/093* | (2006.01) |
| *H03L 7/099* | (2006.01) |

(52) U.S. Cl.
CPC ........... *H03L 7/089* (2013.01); *H03K 5/1565* (2013.01); *H03L 7/093* (2013.01); *H03L 7/0995* (2013.01)

(58) Field of Classification Search
CPC ........... H03K 19/0185; H03K 19/0175; H03K 19/018521; H03K 3/356113; H03K 19/00315; H03K 19/018528; H03K 3/35613; H03K 19/018507; H03K 19/017509; H03K 3/012; H03K 19/0013; H03K 17/102; H03K 3/356182; H03K 3/356104; H03K 17/063; H03K 19/00; H03K 19/0008; H03K 19/003; H03K 17/10; H03K 17/06; H03K 17/00
See application file for complete search history.

(56) References Cited

U.S. PATENT DOCUMENTS

| | | | |
|---|---|---|---|
| 7,977,990 B2 * | 7/2011 | Matsubara | ..... H03K 19/018528 |
| | | | 327/175 |
| 8,108,813 B2 * | 1/2012 | Boerstler | .............. H03L 7/0995 |
| | | | 108/134 |

* cited by examiner

*Primary Examiner* — Diana J. Cheng

(57) ABSTRACT

Technologies directed to phase-locked loop (PLL) duty cycle calibration are described. A circuit includes an amplifier to generate a level-shifted clock with a duty cycle. The circuit further includes comparison logic coupled to an output of the amplifier that compares the duty cycle to a target duty cycle and generates a difference value. Tuning logic coupled to the amplifier adjust the duty cycle based on the difference value.

17 Claims, 5 Drawing Sheets

500

GENERATE, BY THE OSCILLATOR, AN OSCILLATING CLOCK WITH A FIRST DUTY CYCLE 502

↓

RECEIVE, BY THE AMPLIFIER, THE OSCILLATING CLOCK 504

↓

OUTPUT, BY THE AMPLIFIER, A LEVEL-SHIFTED CLOCK WITH A SECOND DUTY CYCLE 506

↓

RECEIVE, BY THE COMPARISON LOGIC, THE LEVEL-SHIFTED CLOCK 508

↓

GENERATE, BY THE COMPARISON LOGIC, A DIFFERENCE VALUE BASED ON A COMPARISON OF THE SECOND DUTY CYCLE TO A TARGET DUTY CYCLE 510

↓

ADJUST, BY THE TUNING LOGIC, THE SECOND DUTY CYCLE GENERATED BY THE AMPLIFIER TOWARDS THE TARGET DUTY CYCLE 512

FIG. 5

DUTY CYCLE CALIBRATION FOR PHASE-LOCKED LOOP

BACKGROUND

A phase-locked loop (PLL) is a control system that generates an output signal whose phase is related to the phase of an input signal. In many instances, the output signal generated by the PLL is a clock having a duty cycle. For some applications where PLLs are used, a certain duty cycle for a clock outputted by a PLL may be desired for reasons such as power consumption, signal integrity, heat dissipation, or clock frequency. In other applications, a precise duty cycle of a clock outputted by a PLL may be required due to design constraints.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 5 illustrates a method of calibrating a duty cycle of a PLL, according to one embodiment.

DETAILED DESCRIPTION

Figure 1:
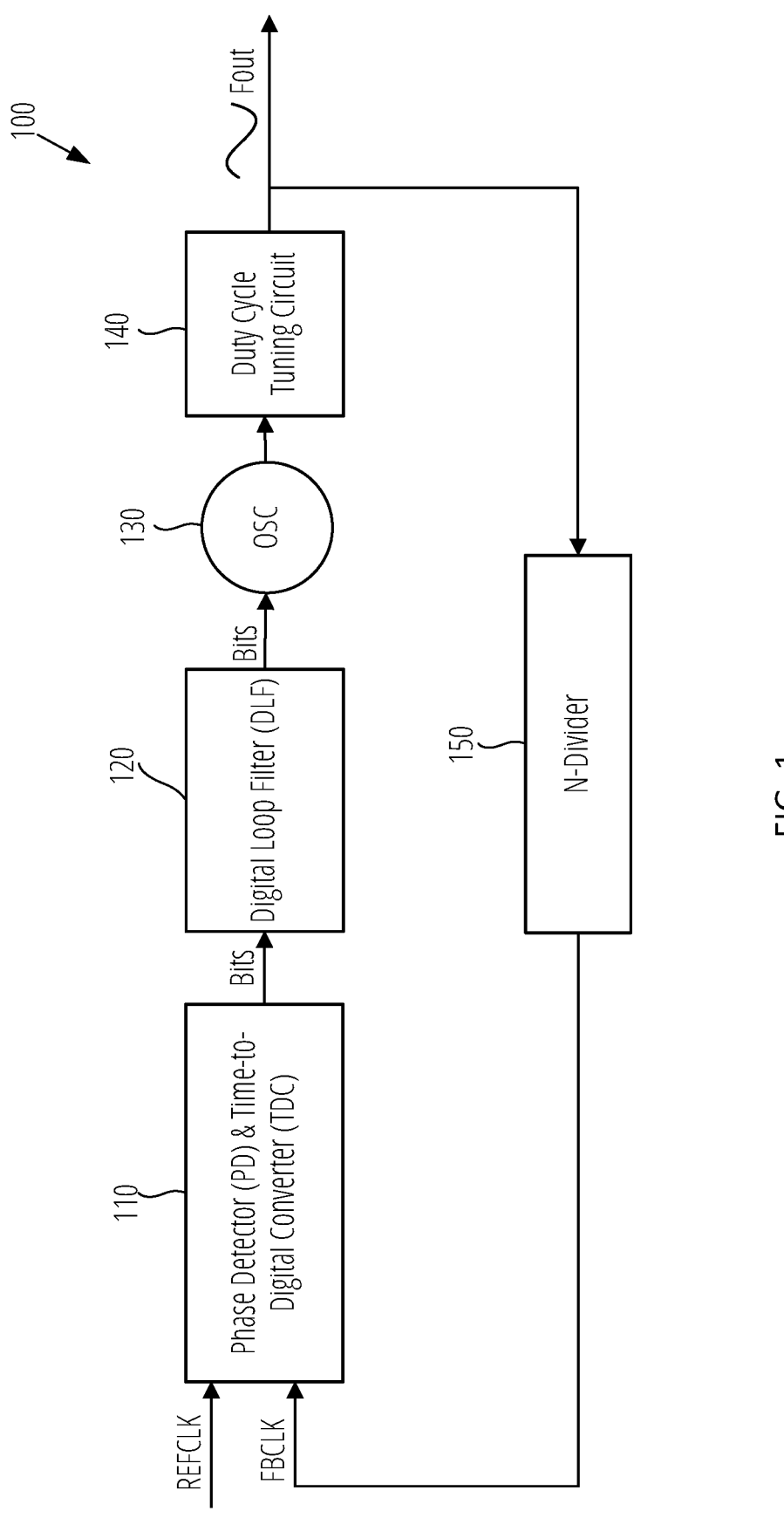
FIG. 1 is a simplified block diagram of a digital phase-locked loop (DPLL) employed in certain electronic devices.

The following description sets forth numerous specific details such as examples of specific systems, components, methods, and so forth, in order to provide a good understanding of various embodiments of a circuit configured to calibrate a duty cycle within a phase-locked loop (PLL) described herein. Such PLLs may be employed in Internet of Things (IoT) applications or in any number of other applications such as home automation and security. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Technologies directed to phase-locked loop (PLL) duty cycle calibration are described. In many PLL circuit applications, such as Internet of Things (IoT) applications, designers endeavor to generate a PLL output duty cycle of as close to 50% as possible. Maintaining duty cycle may enable maintaining precise timing and frequency control, ensuring equal high and low periods in the clock signal, which may result in reliable data transmission and synchronization across devices. In particular, in IoT devices and other applications that include battery-powered devices, maintaining a 50% duty cycle helps minimize power consumption.

Conventional methods of achieving a clock with a 50% duty cycle include designing a PLL at two ("2") times the target frequency and using a flip-flop-based divider to divide the frequency by two while ensuring that the high and low periods of the output clock signal are equal. However, using the flip-flop-based divider has a significant power impact due to the dynamic power used during frequent switching and static power due to leakage currents in the flip-flops that make up the divider.

Aspects and embodiments of the present disclosure introduce a power-efficient circuit for PLL duty cycle calibration, herein referred to as a duty cycle tuning circuit, which enables control of the duty cycle towards 50% or another target duty cycle without the inefficient and power-hungry approach of doubling the frequency at with the PLL operates. In various embodiments, the duty cycle tuning circuit includes comparison logic and tuning logic. The comparison logic compares a duty cycle of a signal outputted by the PLL to the target duty cycle. The tuning logic adjusts the duty cycle of the signal outputted by the PLL based on an output by the comparison logic. The tuning logic may adjust the duty cycle by modifying a bias voltage introduced to the signal outputted by the PLL. In some embodiments, a level shifter receives a first signal (e.g., first clock) with a first duty cycle from an oscillator and level-shifts the first signal into a second signal with a second duty cycle. The second duty cycle may be compared to a target duty cycle by comparison logic, which generates a difference value. Tuning logic may use the difference value to adjust the second duty cycle of the second signal generated by the level-shifter.

FIG. 1 is a simplified block diagram of a digital phase-locked loop (DPLL) 100 employed in certain electronic devices. The DPLL 100 may include a phase detector (PD) and time-to-digital converter (TDC) 110, a digital loop filter (DLF) 120, an oscillator 130, a duty cycle tuning circuit 140, and a frequency divider 150 (e.g., an N-divider frequency divider), generally coupled together in a loop, as illustrated. In such DPLL 100, the PD (of the PD & TDC 110) is adapted to detect a phase and frequency of an input reference clock (REFCLCK) and a feedback clock (FBCLK). Further, in the DPLL 100, the TDC of the PD & TDC 110 is configured to determine a time difference (e.g., a phase error) between the reference frequency (Fref) of the input reference clock and the feedback frequency (Ffb) of the feedback clock.

The TDC of the PD & TDC 110 generates a multi-bit code that digitally encodes the time difference (e.g., quantifies the phase error) and is designed to trigger the oscillator 130 to adjust an output frequency (Fout) of an alternating-current (AC) output signal of the DPLL 100. In some embodiments, the oscillator 130 is a digital oscillator (DCO). The oscillator 130 of DPLLs is generally implemented as a code-to-frequency circuit, where for each input code (e.g., set of digital bits), there is a unique output frequency of the oscillator 130. The DLF 120, which is coupled between the TDC and the oscillator 130, is configured to digitally filter the multi-bit code to ensure accurate delivery of the individual bits of the multi-bit code to the oscillator 130.

In at least some embodiments, the duty cycle tuning circuit 140 monitors and adjusts a duty cycle of an oscillating signal generated by the oscillator 130. To monitor the duty cycle, the duty cycle tuning circuit 140 may compare the duty cycle against a target duty cycle. If the duty cycle is different than the target duty cycle, the duty cycle tuning circuit 140 may alter or modify the duty cycle to come as close as possible to the target duty cycle, e.g., in a feedback control loop as will be discussed in more detail with reference to FIGS. 2-5.

In various applications, the DPLL 100 may be employed in battery-powered consumer electronics, lower-power wireless sensors, home automation systems, remote controls, and automotive memory control units (MCUs), for example, where low cost, low power, less board of materials (BOM), and smaller size are highly desired. The DLF 120 is generally implemented as an on-chip integrated loop filter to further keep the design smaller than analog counterparts. The frequency divider 150 divides the output frequency of the AC output signal by an integer value (N) in order to generate the feedback clock that flows back into the PD & TDC 110. In some embodiments, the frequency divider 150 can be eliminated or frequency division reduced by a factor of two ('2') when implementing the duty cycle tuning circuit 140. In this way, the DPLL 100 need not be designed at twice the frequency in order to then use the frequency divider 150 (or a different frequency divider) to adjust the frequency back to an original frequency with a tuned duty cycle. The DPLL 100 is thus designed to operate in a feedback loop in which the time difference between the input reference clock and the feedback clock is minimized until "locking" onto the frequency and phase of the input reference clock.

In many applications of DPLLs, the time that it takes the oscillator 130 to lock onto the frequency/phase of the reference clock is referred to as locking time. The DPLL 100 typically undergoes a number of iterations through a loop of the DPLL 100 in order for the oscillator 130 to ultimately perform this lock.

Figure 2:
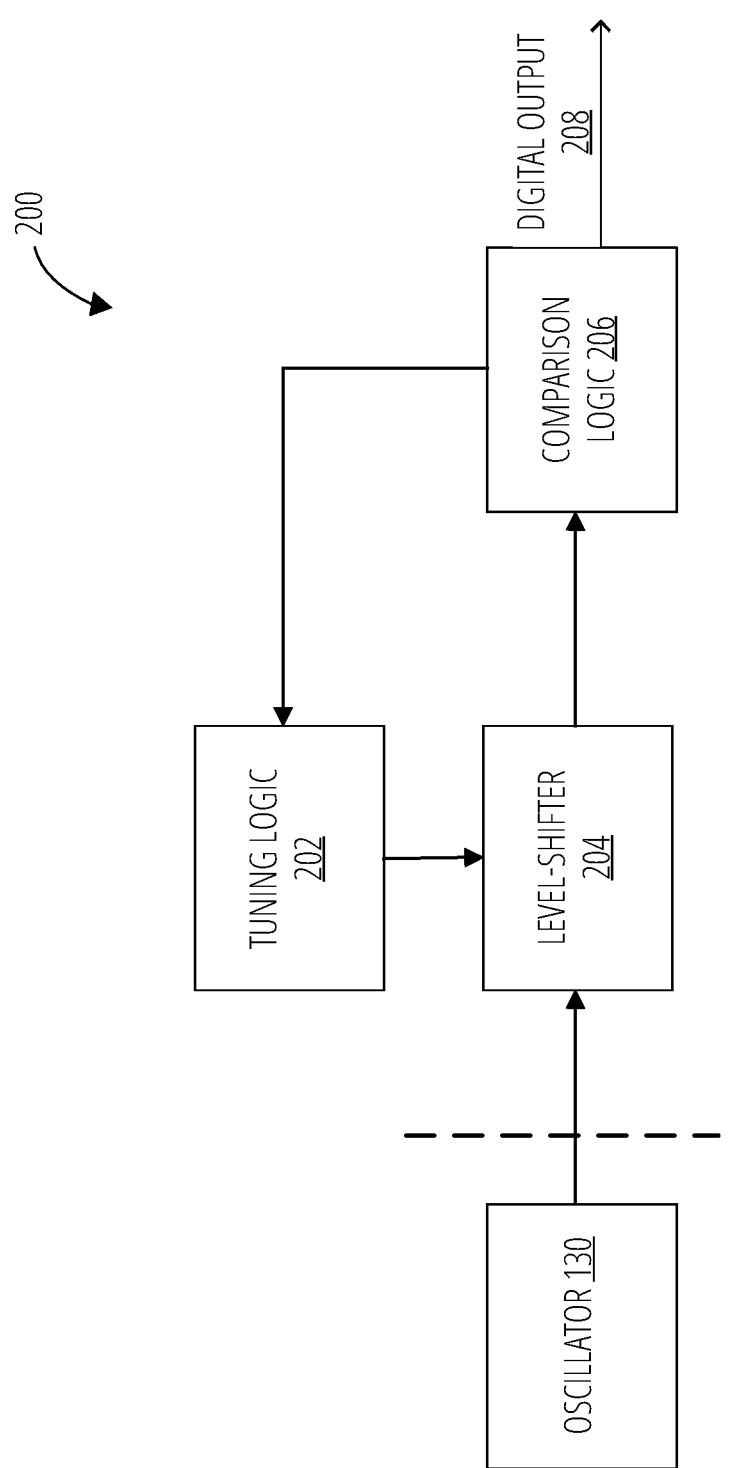
FIG. 2 is a block diagram illustrating a duty cycle tuning circuit within a phase-locked loop (PLL), according to one embodiment.

FIG. 2 is a block diagram illustrating a duty cycle tuning circuit 200 within a phase-locked loop (PLL), according to one embodiment. The circuit 200 may be an embodiment of the duty cycle tuning circuit 140. In various embodiments, the circuit 200 includes an oscillator 130 that generates an oscillating signal (e.g., oscillator clock) that is sent to a level-shifter 204. In one embodiment, the oscillator 130 may be a ring oscillator. The oscillating signal may be a first clock signal. The first clock signal may be susceptible to variations in process, voltage, or temperature (PVT). The PVT variations may be caused by such things as manufacturing imperfections (e.g., semiconductor dopant concentrations, oxide thickness, or the like), fluctuations in power supply, or temperature sensitivity. The first clock signal generated by the oscillator 130 may have a first duty cycle that is likewise susceptible to PVT variations. Unless otherwise stated, duty cycles of the present disclosure, when referenced as a percentage (e.g., 52%), refers to a percentage of a duty cycle that is toggled HIGH. For example, a clock having a duty cycle of 75% refers to a clock that is HIGH 75% of the duty cycle and LOW 25% of the duty cycle.

In some embodiments, the first clock signal is sent to the level-shifter 204. The level-shifter 204 may include one or more amplifiers and feedback resistors. The level-shifter 204 may adjust characteristics of the first clock signal towards desired characteristics. For example, the level-shifter may adjust one or more of the first duty cycle and a voltage level of the first clock signal. In some embodiments, the level-shifter 204 may be said to generate a second clock signal (e.g., a second oscillating signal) by adjusting characteristics of the first duty cycle towards desired characteristics. The level-shifter 204 may adjust characteristics of the first duty cycle by receiving a bias voltage from tuning logic 202. In some embodiments, the tuning logic 202 may include a bias voltage generator. The bias voltage generator may generate a bias voltage that causes the level-shifter 204 to adjust the first clock signal towards desired characteristics. The bias voltage generator is explained in more detail below.

The bias voltage generator may generate the bias voltage based on a difference value provided by a comparison logic 206. The comparison logic 206 receives the second clock signal (e.g., adjusted first clock signal) from the level-shifter 204 and compares a second duty cycle of the second clock signal to a target duty cycle. The target duty cycle may be represented by a reference voltage (e.g., a direct current (DC) voltage). In some embodiments, the reference voltage may be a portion of a supply voltage that corresponds to the target duty cycle. For example, if the target duty cycle is 50%, the reference voltage is half (or substantially half) of the supply voltage. If the target duty cycle is 75%, the reference voltage is three-fourths of the supply voltage.

The comparison logic 206 may compare the second duty cycle of the second clock signal to the target duty cycle by converting the second duty cycle to a DC voltage or a signal resembling a DC voltage (e.g., having negligent alternating current (AC) or noise). The comparison logic 206 may convert the second duty cycle into a first voltage by passing the second clock signal through a low-pass filter (LPF). The first voltage may be a portion of the supply voltage that corresponds to the second duty cycle, similar to how the reference voltage is a portion of the supply voltage that corresponds to the target duty cycle. Once the second duty cycle has been converted to the first voltage, the first voltage and the reference voltage are sent to a comparator.

Figure 3:
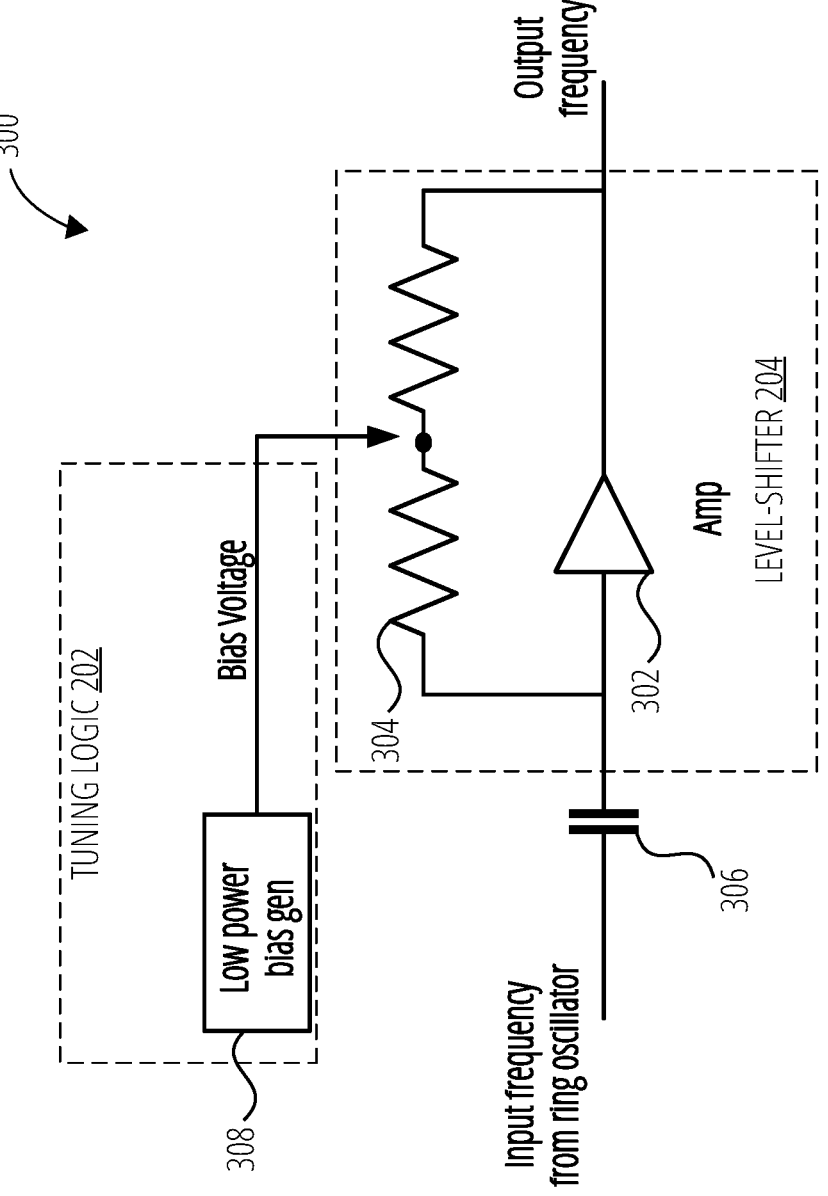
FIG. 3 is a circuit diagram illustrating tuning logic and a level-shifter, according to one embodiment.

FIG. 3 is a circuit diagram 300 illustrating tuning logic 202 and a level-shifter 204, according to one embodiment. The level-shifter 204 may be used to convert a first clock signal (e.g., input signal) with a first amplitude received from the upstream oscillator to a second clock signal (e.g., output signal) with a second amplitude. The second clock signal is then sent to downstream circuitry, such as the comparison logic 206. In some embodiments, the level-shifter 204 may be an amplifier-based level-shifter that uses feedback resistor(s) to set gain and other operating characteristics of an amplifier. In these embodiments, the level-shifter 204 may include an amplifier 302 and a feedback resistor 304. A capacitor 306 may be coupled to an input of the level-shifter 204. The capacitor 306 may help prevent DC bias of an upstream oscillator (e.g., the oscillator 130) from reaching or being passed on by the amplifier 302.

When level-shifting a clock signal from a first amplitude to a second amplitude, the duty cycle of the clock signal may be inadvertently altered in several ways. First, the level-shifter may be coupled to a capacitor to form a resistor-capacitor (RC) circuit. For example, as illustrated, the amplifier 302, the feedback resistor 304, and the capacitor 306 may be coupled together to form an RC circuit. As such, a level-shifted clock signal generated by the level-shifter 204 may have a different frequency than the original clock signal received by the level-shifter 204. The change in frequency may alter the duty cycle of the clock signal.

Second, a clock signal may be characterized as either being "HIGH" or "LOW". Generally, the clock signal is HIGH (e.g., enabled or on) when a predetermined voltage threshold is met and the clock signal is LOW (e.g., disabled or off) when the predetermined voltage threshold is not met. As such, depending on where the predetermined voltage threshold is (i) before level-shifting and (ii) after level-shifting, the proportion of the clock's duty cycle that is HIGH can be unintentionally (or intentionally) modified.

Third, the level-shifter may introduce different delays for the rising edges (e.g., when the clock goes from LOW to HIGH) and falling edges (e.g., when the clock goes from HIGH to LOW) of the clock signal. These delays may be caused by such things as differences in supply voltage and output sides of a level-shifter, inherent capacitances of the level-shifter, an amount of time needed to level-shift from one voltage level to another voltage level. These delays may affect rising edges and falling edges differently, which also affect the duty cycle of the level-shifted clock signal.

While the duty cycle of the level-shifted clock signal may be affected by any of the examples explained above, these are not exhaustive. Instead, a level-shifter may affect the duty cycle of a level-shifted clock signal in a variety of ways, including the three examples above.

In some embodiments, it may be desirable for a duty cycle of a clock signal to be modified (e.g., altered) by a level-shifter. For example, the clock signal may have been generated by an oscillator (e.g., ring oscillator) vulnerable to some PVT variation. The duty cycle of such a clock signal may not the same or substantially similar to a target duty cycle (e.g., target duty cycle). In these embodiments, it may be desirable to have an ability to intentionally modify the duty cycle to be the same or substantially similar to the target duty cycle.

In the illustrated example, the level-shifter 204 level-shifts a first clock signal with a first frequency and a first duty cycle (e.g., an input signal) into a second clock signal with a second frequency and a second duty cycle (e.g., an output signal). The capacitor 306 and the level-shifter 204 combine to create an RC circuit that causes the second frequency to be different than the first frequency. After level-shifting the first clock signal into the second clock signal, the second duty cycle may not be the same or substantially similar to the target duty cycle. This may be caused by either (i) PVT variations caused by the upstream oscillator (e.g., oscillator 130) or (ii) the transitioning from the first clock signal to the second clock signal.

In various embodiments, the tuning logic 202 is coupled to the level shifter 204 and is designed to adjust the second duty cycle of the second clock cycle based on a difference between the second duty cycle and the target duty cycle. This difference may be represented by a difference value. In some embodiments, the difference value may be based on an output of the comparison logic 206. In other embodiments, the comparison logic 206 may output the difference value. The comparison logic 206 is explained in more detail below with respect to FIG. 4.

In some embodiments, the tuning logic 202 includes a low-power bias generator 308 configured to generate a bias voltage. In some embodiments, the feedback resistor 304 is a potentiometer (e.g., a trimmer potentiometer) that is tapped at a location along various resistive components, thus enabling a resistance of the feedback resistor to be adjusted. In at least some embodiments, a bias voltage generated by the low power bias generator 308 is provided to the level-shifter 204 at the tapped location on the feedback resistor 304. The tapped location may be adjusted based on the difference value. For example, the low power bias generator 308 may be coupled to a wiper of the potentiometer. In another embodiment, the feedback resistor 304 may be adjusted based on instructions from a controller (e.g., micro-controller) based on the difference value. The potentiometer may be iteratively adjusted (e.g., adjusted multiple times) until the second duty cycle (from the output of the comparison logic 206) is the same or similar to the target duty cycle. Notwithstanding the description above with respect to a potentiometer, any embodiment that allows the low power bias generator 308 to be coupled to the feedback resistor 304 at an adjustable tapped location may be used.

In some embodiments, the low power bias generator 308 may generate and/or adjust the bias voltage based on the difference value. For example, the bias voltage may be increased or decreased based on the difference value. In some embodiments, a controller or other logic may increase or decrease the bias voltage based on the difference value. The low-power bias generator 308 may iteratively increase or decrease the bias voltage until the second duty cycle is the same or similar to the target duty cycle.

In some embodiments, based on the difference value, a combination of (i) adjusting a tapped location where the bias voltage is introduced to the feedback resistor 304 and (ii) adjusting the bias voltage may be used.

Figure 4:
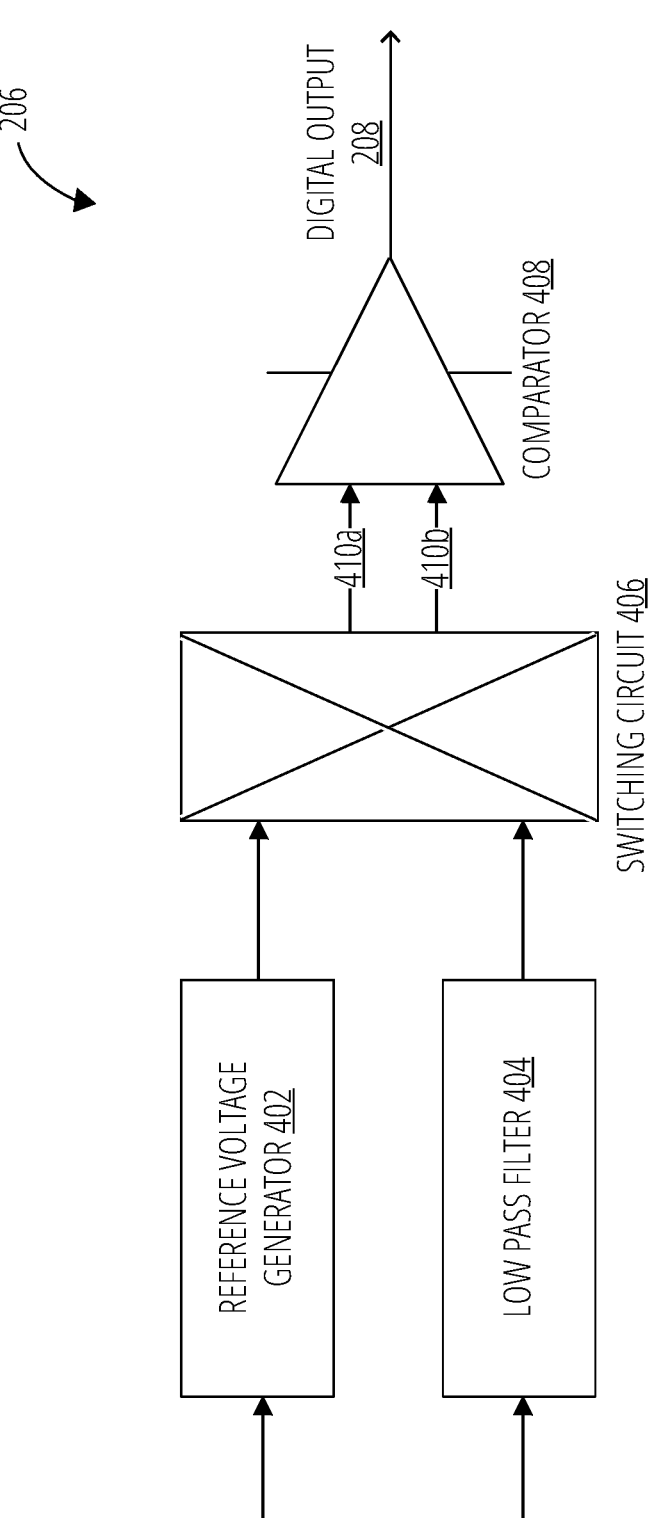
FIG. 4 is a circuit diagram illustrating comparison logic, according to one embodiment.

FIG. 4 is a circuit diagram illustrating the comparison logic 206, according to one embodiment. In at least some embodiments, the comparison logic 206 includes a reference voltage generator 402. The reference voltage generator 402 may receive a supply voltage of the circuit and generate a reference voltage that, when compared to the supply voltage, is associated with (e.g., corresponds to) a target duty cycle. In other words, the reference voltage may be a portion of the supply voltage proportional to the target duty cycle. For example, if the target duty cycle is 50%, the reference voltage generator 402 generates a reference voltage that is half of the supply voltage. As another example, if the target duty cycle is 75%, the reference voltage generator 402 generates a reference voltage that is three-fourths of the supply voltage.

In various embodiments, the comparison logic 206 also includes a low pass filter (LPF) 404. The LPF 404 may receive an oscillating signal from upstream circuitry and outputs a first voltage. In some embodiments, the oscillating signal received by the LPF 404 is the second clock signal as described above with respect to FIGS. 2-3. In response to receiving the second clock signal, the LPF 404 may be designed such that the first voltage, when compared to the supply voltage, corresponds to the second duty cycle of the second clock signal. In other words, the first voltage may be a portion of the supply voltage proportional to the second duty cycle. For example, if the second duty cycle is 25%, the first voltage is one-fourth of the supply voltage. As another example, if the second duty cycle is 50%, the first voltage is half of the supply voltage.

In some embodiments, once the first voltage is generated by passing the second clock signal through the LPF 404, the reference voltage and the first voltage are compared at a comparator 408. The comparator 408 determines whether the first voltage is (i) greater than, (ii) less than, or (iii) substantially equal to the reference voltage. In some embodiments, to be (iii) substantially equal to the reference voltage, the comparator 408 may determine that the first voltage is within a target range of voltages around the reference voltage. In these embodiments, the comparator 408 may include a hysteresis comparator or a Schmitt trigger. A hysteresis comparator may include a gap near the threshold of the comparator that provides hysteresis, which prevents rapid switching of the output due to variation in the input of the hysteresis comparator. For example, if the reference voltage is 50% of the supply voltage, the comparator 408 may determine that the first voltage is substantially equal to the reference voltage if the first voltage is no less than 48% of the supply voltage and no greater than 52% of the supply voltage. This, in turn, indicates that the target duty cycle is 50% and the second duty cycle of the second clock is between 48-52%. This example assumes that error tolerance of the second duty cycle is within 2% of the target duty cycle. However, the error tolerance of the second duty cycle may be set at different values, such as 1%, 0.5%, or 5%, depending on requirements of the PLL.

If the comparator 408 determines that the first voltage is not substantially equal to the reference voltage, a difference value may be computed based on a digital output 208. The digital output 208 represents a difference between the first voltage and the reference voltage, which in turn represents a difference between the second duty cycle and the target duty cycle. The comparator 408 may output the digital output 208. The digital output 208 may be the difference value. The difference value may be sent from the comparator 408 to the tuning logic 202. The tuning logic 202 may include a controller (e.g., microcontroller) that receives the difference value and adjusts the second duty cycle of the second clock signal based on the difference value.

In some embodiments, the comparator 408 is a low-offset comparator having a first input terminal 410a and a second input terminal 410b. In general, a low-offset comparator is designed to have a very small input offset voltage, typically in the microvolt range, which allows it to accurately compare voltages that are very close together. This is different from a normal comparator, which may have a higher input offset voltage, leading to less precision in detecting small differences between input voltages. The low-offset comparator 408 may be particularly useful in applications where high precision is required, such as in PLLs.

In at least some embodiments, the comparison logic 206 further includes a switching circuit 406 that receives the reference voltage from the reference voltage generator 402 and the first voltage from the LPF 404. The comparison logic 206 may include the switching circuit 406 to alternately switch the reference voltage and the first voltage between the first input terminal 410a and the second input terminal 410b, e.g., which may provide offset cancellation ability to the comparison logic 206. The switching circuit 406 may be coupled to the input terminals 410a-b to reduce noise and improve accuracy and overall resolution of the voltage comparison by the comparator 408. For example, the switching circuit 406 may reset or correct any voltage drift or voltage surge. Each time that the inputs of the switching circuit 406 switch between the first voltage and the reference voltage, the digital output 208 may become inverted. This inversion may be accounted for by a controller that receives the digital output 208. For example, the controller may be a programmed processor, a central processing unit (CPU), a graphics processing unit (GPU), a microcontroller, or other logic that accounts for the inversion and optionally also uses the output voltage with the adjusted duty cycle. In some embodiments, such a controller or other circuitry that receives the output voltage with the adjusted duty cycle generates a stable clock from a less stable signal. Other applications for the DPLL 100 include, but are not limited to, frequency synthesis, data recovery, jitter reduction, modulation and demodulation of other signals, and other frequency control and signal generation applications.

FIG. 5 illustrates a method 500 of calibrating a duty cycle of a signal within a PLL, according to one embodiment. The method 500 may be performed by the circuit 200 of FIG. 2 along with accompanying descriptions in FIGS. 3-4. The operations need not be performed in a specific order, unless explicitly disclosed to be required to be performed in such an order.

At operation 502, method 500 includes generating, by the oscillator 130, an oscillating clock with a first duty cycle.

At operation 504, method 500 further includes receiving, by the amplifier 302 of the level-shifter 204, the oscillating clock.

At operation 506, method 500 further includes outputting, by the amplifier 302 of the level-shifter 204, a level-shifted clock with a second duty cycle.

At operation 508, method 500 further includes receiving, by the comparison logic 206, the level-shifted clock.

At operation 510, method 500 further includes generating, by the comparison logic 206, a difference value based on a comparison of the second duty cycle to a target duty cycle.

At operation 512, method 500 further includes adjusting, by the tuning logic 202, the second duty cycle generated by the amplifier towards the target duty cycle.

Various embodiments of calibrating a duty cycle of a signal within a PLL described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit, comprising:

an amplifier to receive an oscillator clock with a first duty cycle and output a level-shifted clock with a second duty cycle;

tuning logic coupled to the amplifier; and comparison logic coupled between an output of the amplifier and the tuning logic, wherein the comparison logic is to generate a difference value based on a difference between the second duty cycle and a target duty cycle;

wherein the tuning logic is to adjust, based on the difference value, the second duty cycle generated by the amplifier; and wherein the comparison logic comprises a low pass filter (LPF) to receive the level-shifted clock and generate a first voltage proportional to the second duty cycle, and wherein the comparison logic is to compare the first voltage to a reference voltage associated with the target duty cycle.

2. The circuit of claim 1, wherein the first voltage generated by the LPF is a first portion of a supply voltage, and wherein the first portion corresponds to the second duty cycle.

3. The circuit of claim 1, wherein the comparison logic further comprises:

a low-offset comparator comprising a first input terminal and a second input terminal, wherein the low-offset comparator is to compare voltages on the first input terminal and the second input terminal; and a switching circuit coupled between the LPF and the low-offset comparator, wherein the switching circuit is configured to alternately switch the first voltage and the reference voltage between the first input terminal and the second input terminal.

4. The circuit of claim 1, wherein the target duty cycle comprises between 48 to 52 percent.

5. The circuit of claim 1, further comprising a feedback resistor coupled between the output and an input of the amplifier, the feedback resistor being tapped to receive a bias voltage, and wherein the tuning logic is configured to generate the bias voltage based on the difference value.

6. The circuit of claim 1, further comprising a feedback resistor coupled between the output and an input of the amplifier, the feedback resistor being tapped to receive a bias voltage, and wherein a location where the feedback resistor is tapped is adjusted based on the difference value.

7. A phase-locked loop (PLL), comprising:

an oscillator to generate an oscillator clock with a first duty cycle;

an amplifier coupled to the oscillator, wherein the amplifier is to receive the oscillator clock and output a level-shifted clock with a second duty cycle;

tuning logic coupled to the amplifier; and comparison logic coupled between an output of the amplifier and the tuning logic, wherein the comparison logic is to generate a difference value based on a difference between the second duty cycle and a target duty cycle;

wherein the tuning logic is to adjust, based on the difference value, the second duty cycle generated by the amplifier; and wherein the comparison logic comprises a low pass filter (LPF) to receive the level-shifted clock and generate a first voltage proportional to the second duty cycle, and wherein the comparison logic is to compare the first voltage to a reference voltage associated with the target duty cycle.

8. The PLL of claim 7, wherein the first voltage generated by the LPF is a first portion of a supply voltage, and wherein the first portion corresponds to the second duty cycle.

9. The PLL of claim 7, wherein the comparison logic further comprises:

a low-offset comparator comprising a first input terminal and a second input terminal, wherein the low-offset comparator is to compare voltages on the first input terminal and the second input terminal; and a switching circuit coupled between the LPF and the low-offset comparator, wherein the switching circuit is configured to alternately switch the first voltage and the reference voltage between the first input terminal and the second input terminal.

10. The PLL of claim 7, wherein the target duty cycle comprises between 48 to 52 percent.

11. The PLL of claim 7, further comprising a feedback resistor coupled between the output and an input of the amplifier, the feedback resistor being tapped to receive a bias voltage, and wherein the tuning logic is configured to generate the bias voltage based on the difference value.

12. The PLL of claim 7, further comprising a feedback resistor coupled between the output and an input of the amplifier, the feedback resistor being tapped to receive a bias voltage, and wherein a location where the feedback resistor is tapped is adjusted based on the difference value.

13. The PLL of claim 7, wherein the oscillator is a ring oscillator.

14. A method of operating a phase-locked loop (PLL) circuit comprising an amplifier, an oscillator coupled to the amplifier, tuning logic coupled to the amplifier, and comparison logic coupled between the amplifier and tuning logic, the method of operating the PLL circuit comprising:

generating, by the oscillator, an oscillating clock with a first duty cycle;

receiving, by the amplifier, the oscillating clock;

outputting, by the amplifier, a level-shifted clock with a second duty cycle;

receiving, by the comparison logic, the level-shifted clock;

generating, by the comparison logic, a difference value based on a comparison of the second duty cycle to a target duty cycle, wherein generating the difference value comprises:

inputting the level-shifted clock to a low pass filter (LPF), outputting, by the LPF, a first voltage proportional to the second duty cycle, and comparing the first voltage to a reference voltage associated with the target duty cycle; and adjusting, by the tuning logic, the second duty cycle generated by the amplifier towards the target duty cycle.

15. The method of claim 14, wherein the comparison logic further comprises a switching circuit and a low-offset comparator comprising a first input terminal and a second input terminal, and wherein comparing the first voltage to the reference voltage comprises:

comparing, by the low-offset comparator, voltages on the first input terminal and the second input terminal;

receiving, by the switching circuit, the first voltage and the reference voltage; and alternately switching, by the switching circuit, the first voltage and the reference voltage between the first input terminal and the second input terminal.

16. The method of claim 14, wherein the target duty cycle comprises between 48 to 52 percent.

17. The method of claim 14, wherein the PLL circuit further comprises a feedback resistor coupled between the output and an input of the amplifier, the feedback resistor being tapped to receive a bias voltage, and wherein adjusting the second duty cycle towards the target duty cycle comprises generating, by the tuning logic, the bias voltage based on the difference value.

* * * * *